United States Patent [19]

Peacock

[11] Patent Number: 4,535,417
[45] Date of Patent: Aug. 13, 1985

[54] METHOD AND APPARATUS FOR DIGITAL TIME-VARIANT FILTERING

[75] Inventor: Kenneth L. Peacock, Tulsa, Okla.

[73] Assignee: Standard Oil Company, Chicago, Ill.

[21] Appl. No.: 452,474

[22] Filed: Dec. 23, 1982

[51] Int. Cl.³ .............................................. G06F 15/31
[52] U.S. Cl. ...................................... 364/724; 367/45
[58] Field of Search ........................... 364/724; 367/45

[56] References Cited

U.S. PATENT DOCUMENTS

| 3,701,091 | 10/1972 | Lenihan | 367/45 |
| 4,106,102 | 8/1978 | Desblache | 364/724 |
| 4,435,773 | 3/1984 | Göckler et al. | 364/724 |

OTHER PUBLICATIONS

Cain, "Hilbert–Transform Description of Linear Filtering", *Electronics Letters*, Jul. 27, 1972, vol. 8, No. 15, pp. 380–382.
Roy et al., "Digital Low–Pass Filtering Using the Discrete Hilbert Transform", *IEEE Trans. on Acoustics, Speech & Signal Processing*, vol. ASSP–26, No. 5, Oct. 1978, pp. 465–467.
Sabri et al., "Discrete Hilbert Transform Filtering", *IEEE Trans. on Acoustics, Speech & Signal Processing*, vol. ASSP–25, No. 5, Oct. 1977, pp. 452–454.
Saraga, "New Class of Time–Varying Filters", *Electronics Letters*, Apr. 1967, vol. 3, No. 4, pp. 156–159.
Gold et al., "Theory & Implementation of the Discrete Hilbert Transform", *Computer Processing in Communications*, 1969, pp. 235–250.

Primary Examiner—David H. Malzahn
Attorney, Agent, or Firm—Timothy D. Stanley

[57] ABSTRACT

A method and apparatus for digital time-variant filtering are disclosed. The digital time-variant filters are implemented using the Hilbert transform and a time-varying instantaneous frequency control function for controlling the cutoff frequency. The digital time-variant filters are adaptable to various filtering processes, that is, as either a high-cut, low-cut, band-pass, or reject filter. The various digital time-variant filters are stable in that no unusual transients occur in the output signal; are flexible in that the cutoff frequency is controlled by a selectable time-varying control function signal; and are efficient in that computational requirements are only twice to 16 times that of known digital time-invariant filters.

15 Claims, 8 Drawing Figures

Q AND LF ARE WEIGHTING STRENGTH AND OPERATOR LENGTH, RESPECTIVELY, FOR HILBERT TRANSFORM OPERATOR $h_t$. THESE TWO PARAMETERS CONTROL ROLL OFF AND ATTENUATION IN THE FREQUENCY DOMAIN. $\hat{f}_t$ IS THE INTEGRATION OF CONTROL FUNCTION $f_t$.

Q AND LF ARE WEIGHTING STRENGTH AND OPERATOR LENGTH, RESPECTIVELY, FOR HILBERT TRANSFORM OPERATOR $h_t$. THESE TWO PARAMETERS CONTROL ROLL OFF AND ATTENUATION IN THE FREQUENCY DOMAIN. $\hat{f}_t$ IS THE INTEGRATION OF CONTROL FUNCTION $f_t$.

IMPULSING THE TIME-INVARIANT MODE OF THE HILBERT TRANSFORM FILTER. THIS AMPLITUDE RESPONSE OCCURS WHEN PARAMETERS Q AND LF ARE SET TO 3 AND 61, RESPECTIVELY. FREQUENCY CUTOFF $F_o$ IS 30 Hz AND SAMPLING INTERVAL $\Delta t$ IS .002 SEC. THE FREQUENCY CHARACTERISTICS MEASURE AS FOLLOWS: $F_1 = 21$ Hz, $F_2 = 39$ Hz, DB1 = 20 dB, AND DB2 = 45 dB.

SKETCH OF WEIGHTING STRENGTH Q REQUIRED TO GIVE MINIMUM
ATTENUATION DB2. CONTINUOUS LINE IS FOR THE EQUATION
$Q = -.001657 DB2^2 - .4712$.

IMPULSE RESPONSE OF TIME-VARIANT HILBERT TRANSFORM FILTER. AMPLITUDE AND ATTENUATION RESPONSES CORRESPOND TO EVENT AT 1 SEC.

AMPLITUDE AND ATTENUATION RESPONSE OF A
TIME-VARIANT HILBERT TRANSFORM FILTER.
PARAMETERS OTHERWISE MATCH THOSE OF FIG.5.

METHOD AND APPARATUS FOR DIGITAL TIME-VARIANT FILTERING

BACKGROUND OF THE INVENTION

This invention relates generally to the analysis of information which is represented by electrical signals. More particularly, this invention applies to geophysical exploration for petroleum and minerals by means of the seismic technique, whereby acoustic energy is imparted to the earth and the resulting seismic wave which propagates through the earth is reflected and/or refracted at the interfaces of different subsurface geological formations; the reflections and/or refractions are detected, converted to electrical signals, and stored; and the stored electrical signals are analytically processed in order to map the subsurface geological structure. Specifically, this invention is directed to a method and apparatus for processing electrical signals so that the frequency response characteristics, for example, the frequency response of the earth to the acoustic stimulus, can be analyzed in order to yield more precise knowledge, in the example, knowledge about the subsurface geological structure based on the seismic information contained in the electrical signals such that further processing and/or displaying of the information will result in a seismic section of improved resolution.

As is well known, any electrical signal, no matter how complex, is comprised of a number of fundamental component signals of different amplitudes and frequencies which, when combined, form the electrical signal. Today many electrical signals, including most seismic information obtained in the field, is in digital form. Digital filtering is a process using digital techniques whereby the component signals within a selected range of frequencies can be selected, that is, sorted, from the larger suite of component signals of the electrical signal.

Now, the purpose for digital filtering can be addressed. Generally, the electrical signal contains some informational signal of interest plus additive noise, that is, the informational signal is contaminated by noise. The noise contamination impacts the susceptibility of the electrical signal to analysis in order to extract the informational signal.

The use of digital filtering in information processing is now well established in such diverse fields as communications, radar, etc. Digital filtering has also been used in the geophysical field (Kulhánek, Ota, 1976, Introducton to Digital Filtering in Geophysics: Amsterdam, Elsevier Scientific Publishing Co.). Digital filtering in the geophysical field is now very broad and can be divided into more specialized subfields, such as predictive deconvolution (Peacock, K. L., and Treitel, S., 1969, Predictive Deconvolution: Theory and Practice: Geophysics, v. 39, pp. 155–169), adaptive filtering (Widrow, B., McCool, J. M., Larimore, M. G., and Johnson, C. R., 1976, Stationary and Nonstationary Learning Characteristics of the LMS Adaptive Filter: IEEE Proceedings, v. 64, pp. 1151–1162), two-dimensional filtering (Clement, W. G., 1973, Basic Principles of Two-Dimensional Digital Filtering: Geophysical Prospecting, v. 21, pp. 125–145), and time-variant filtering (Lenithan, U.S. Pat. No. 3,701,091). Development and application of digital filtering in the geophysical field have expanded rapidly in recent years as the use of computers has become more widespread and filtering processes have been performed by computer.

Time-variant filtering is a process for sorting the component signals from the electrical signal wherein the filtering process is modified over time. Time-variant filtering is sometimes necessary to analyze electrical signals which themselves have a time-variant character. For example, seismic information in the form of electrical signals often exhibits a progressive loss of high-frequency content over time (see above-mentioned U.S. Pat. No. 3,701,091 to Lenihan and Gurbuz, B. M., 1972, Signal Enhancement of Vibratory Source Data in the Presence of Attenuation: Geophysical Prospecting, v. 20, pp. 421–438, at page 428).

Considered in greater detail, during the course of seismic prospecting, such as the mapping of the subsurface geological structure by creating a seismic wave and observing the arrival times of the wave reflected from acoustic-impedance contrasts or refracted through high-velocity members, the amplitude of the wave decays as it propagates through the earth. Furthermore, the amplitude decay will be frequency dependent in that the higher frequency seismic wave components tend to suffer greater amplitude attenuation, particularly at later arrival times. Generally, several factors are viewed as contributing to the amplitude attenuation, such as geometrical spreading, reflection absorption, scattering, and various other acoustic transmission loss mechanisms.

A technique for recognizing amplitude decay as a function of time and frequency is to perform a Fourier analysis of the seismic information and view the phenomenon in the frequency domain. In particular, it is observed that the frequency content along the length of the seismic section will shift to lower frequencies as time increases. This evidences that higher frequency seismic wave components are attenuated at a faster rate than lower frequency components. Therefore, the earlier acquired seismic wave reflections and/or refractions, which represent the shallow subsurface geological formations, have a higher mean frequency than the later acquired reflections and/or refractions, which represent the deep subsurface formations. Frequency dependent absorption with depth (that is, time of arrival) not only creates a problem in interpreting observed seismic wave reflections and/or refractions, but also has an analogous influence when it is attempted to construct a priori a synthetic seismic section. For a theoretical discussion of the effect of frequency in depth dependent absorption when constructing a synthetic seismic section see Trovey, A. W., 1962, Theoretical Seismograms with Frequency and Depth Dependent Absorption: Geophysics, v. 27, pp. 766–785.

Now, recorded seismic information always includes some background (ambient) noise in addition to the detected seismic waves reflected and/or refracted from the subsurface geological formation (referred to as the "seismic signal"). Noise originates from many sources, such as atmospheric electromagnetic disturbances, wind, motor vehicle traffic in the vicinity of the prospect area, recorder electrical noise, etc. The noise contaminates the seismic signal. Unfortunately, the amplitude of the noise on each seismic record is not known. Only the amplitude of the seismic signal plus the noise is known.

Digital filtering has traditionally been applied for rejecting frequency components outside the band of interest in order to reduce noise, that is, improve the signal-to-noise ratio. In accordance with the present invention, filtering is caused to reject increasingly lower frequencies with increasing time in recognition of the phenomenon that higher frequency components of the seismic signal are increasingly attenuated over time, and therefore, the seismic signal components at higher frequencies are virtually nonexistent in the later portion of the seismic record; that is, higher frequencies present in the later portion of the seismic record are dominated by noise.

Lenihan, U.S. Pat. No. 3,701,091, mentioned above, discloses a digital technique for time-varying filtering of seismic signals which preferably involves three steps. The initial step is selecting a set of individual digital filters having predetermined start times. This set of digital filters serves as the input. The start times, as well as the passband, of these input filters are determined by analyzing the seismic signals, for example, by frequency analysis, in order to ascertain the frequency of the signals and where the frequency changes occur, whereby it can be determined where changes are needed in the filters to adapt to the frequency changes. Next, a set of individual digital time-variant filters is formed from the input set of filters; that is, the center frequency and envelope frequency of the input filters are determined, and additional individual digital filters are interpolated between adjacent input filters based on the difference in center frequency between adjacent input filters. Then, the time responses of the filters are determined and truncated.

Unfortunately, the technique disclosed by Lenihan, U.S. Pat. No. 3,701,091, requires that a high number of interpolated filters be interposed between the input filters in order to obtain a smoothly varying set of filters over time, as otherwise there will be discontinuities in the filtered seismic signals. Such an approach necessitates a lengthy computation time, since each of the interpolated filters is calculated. Furthermore, the calculations themselves are complex, and therefore, even in a case where a relatively low number of filters is interpolated and the smoothness of the filtering is compromised, computation time is still considerable. The present invention provides a method and apparatus for digital time-varying filtering which obtains smooth, continuous filtered seismic signals and at the same time is less complex than disclosed by Lenihan, U.S. Pat. No. 3,701,091, and requires less computation time.

Cain, G. D., 1972, Hilbert Transform Description of Linear Filtering: Electronics Letters, v. 8, pp. 380–382, discloses analog time-invariant Hilbert transform filters. Roy, S. C. D., and Agarwal, A., 1978, Digital Low-Pass Filtering Using the Discrete Hilbert Transform: IEEE Trans., v. ASSP-26, pp. 465–467, and Sabri, M. S., and Steenaart, W., 1977, Discrete Hilbert Transform Filtering: IEEE Trans., v. ASSP-25, pp. 452–454, describe digital Hilbert transform filters. However, these digital Hilbert transform filters are not time-variant. The above-mentioned article by Cain suggests time-variant Hilbert transform filters. One author has discussed time-variant Hilbert transform filters, Saraga, W., 1967, New Class of Time-Varying Filters: Electronic Letters, v. 3, pp. 158–160. These time-variant Hilbert transform filters are analog filters rather than digital. The present invention deals with digital filters based on the Hilbert transform that permit time-variant filtering to be easily implemented. Because of the physical limitations associated with analog filters, the digital filters of the invention are more flexible with respect to minimizing phase distortion and with respect to achieving high accuracy.

SUMMARY OF THE INVENTION

In accordance with the invention, a digital time-variant filtering method and apparatus are implemented using the Hilbert transform and a digital time-varying instantaneous frequency control function, preferably a swept-frequency signal, for processing a digital electrical signal having a time-varying character. The control function provides a variable cutoff frequency, that is, cutoff frequency varies as a function of time. The digital time-variant Hilbert transform filters of the invention are adaptable to various filtering processes, that is, as either a high-cut, low-cut, band-pass, or reject filter.

The method of the invention for processing a digital electrical signal having a time-varying character comprises the steps of: selecting a digital time-varying control function signal for controlling cutoff frequency; discretely integrating the selected control function signal; combining the electrical signal with the integrated control function signal; applying a Hilbert transform operator to the combined electrical signal and integrated control function signal; and extracting a time-variant filtered electrical signal from the combined electrical signal and integrated control function signal to which the operator has been applied; wherein the Hilbert transform operator is determined by selecting a roll-off interval for time-variant filtering; selecting an attenuation value for time-variant filtering; determining a Hilbert transform strength of weighting based on the selected attenuation value; determining a Hilbert transform operator length based on the selected roll-off interval and the attenuation value; and determining the Hilbert transform operator based on the strength of weighting and the operator length. These steps produce high-cut filtering. The additional step of subtracting a high-cut output signal from the electrical signal produces low-cut filtering. Alternatively, the addititonal step of subtracting a first high-cut output signal from a second high-cut output signal produces band-pass filtering. The additional step of subtracting a band-pass output signal from the electrical signal produces reject filtering. In a preferred embodiment of the apparatus of the invention, the information processing aspects are performed by a programmed general purpose digital computer for filtering the electrical signal. In one specific example, the electrical signal is digitized seismic information which is filtered for improving seismic resolution in the late arrivals of a seismic record.

Roll-off interval and rejection in the frequency domain are accurately specified a priori by means of parameters derived from empirical equations. In particular, the critical parameters of operator length and strength of weighting can be defined in terms of filter roll off and attenuation.

The maximum frequency in the electrical signal to be filtered is preferably limited to one-half Nyquist frequency, that is, one-fourth the sampling frequency. This allows modulation to occur within the digital time-variant Hilbert transform filters of the invention without distortion.

Digital time-variant filtering based on the Hilbert transform in accordance with the invention is superior to known digital time-variant filtering techniques in terms of flexibility, stability, and computer efficiency. The digital time-variant Hilbert transform filters of the invention are stable in that no unusual transients occur in the output signal; are flexible in that the cutoff frequency is controlled by a selectable digital time-varying control function, such as a swept-frequency signal; and are efficient in that computational requirements are only twice to 16 times that of known digital time-invariant filters. The digital time-variant Hilbert transform filters of the invention are particularly suited from an applications standpoint for use in seismic information processing.

BRIEF DESCRIPTION OF THE DRAWINGS

The above and other features of this invention and a better understanding of the principles and details of the invention will be evident to those skilled in the art in view of the following description of the preferred embodiments given in conjunction with the accompanying drawings, in which.

DESCRIPTION OF THE PREFERRED EMBODIMENTS

Figure 1:
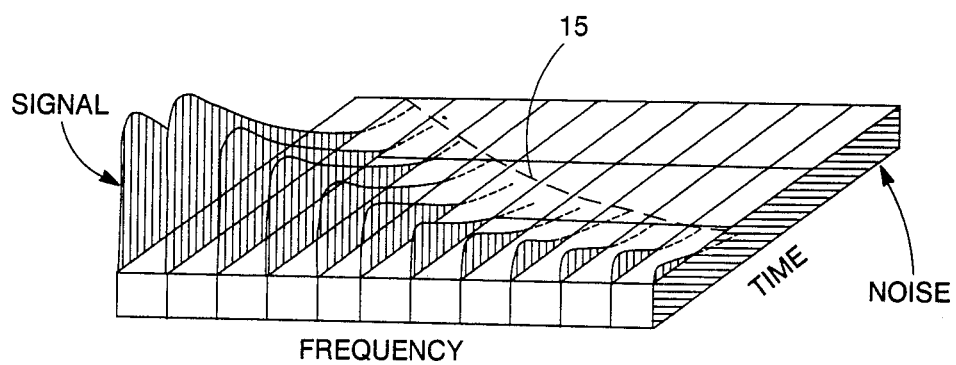
FIG. 1 is a representation of a seismic record useful for explaining the basis for digital time-variant Hilbert transform filtering in accordance with the invention.

FIG. 1 is an idealized two-dimensional representation of a record of detected seismic wave reflections and/or refractions depicting the seismic signal as being composed of frequency bands which are a function of the time of arrival. A third independent variable, source-to-detector, or source-to-receiver, distance is accounted for in that FIG. 1 represents an arbitrary but unique source-to-detector distance. FIG. 1 is intended to reflect certain fundamental characteristics of seismic information such as the relatively higher intensity at lower frequencies and the relative decay of amplitude with increasing time. Specifically, FIG. 1 is a plot of the envelope of the spectral amplitude (smoothed Fourier transform) of a single idealized seismic record calculated along the time axis of that record.

Because of the inability to empirically separate signal from noise, no definitive statement can be made as to the actual signal-to-noise ratio. Since the signal envelope tends to plateau and level off with increasing time, the portion of the observed amplitude which lies above the plateau at early times of arrival is characterized entirely as signal. However, this does not justify the converse, namely, that the plateau is categorically all noise, and this is illustrated by the extrapolation of the signal curve to later arrival times by using a dotted line that penetrates into and below the plateau. Nevertheless, the comparative decay in the high frequency components of the signal with time is apparent as illustrated by the dashed line 15.

The properties of time-variant Hilbert transform filters can be derived as follows. Let the input electrical signal x(t) to be filtered be sinusoid $\cos 2\pi F t$, and let the control function f(t) be constant $F_o$. The output electrical signal y(t) can be computed as follows:

$$y(t) = -\sin 2\pi F_o t \cdot H\{\cos 2\pi F_o t \cos 2\pi F t\} + \cos 2\pi F_o t \cdot H\{\sin 2\pi F_o t \cos 2\pi F t\}.$$

Since $$2 \cos A \cos B = \cos(A+B) + \cos(A-B)$$

and $$2 \sin A \cos B = \sin(A+B) + \sin(A-B),$$

the above becomes $$y(t) = -\sin 2\pi F_o t \cdot H\{\tfrac{1}{2} \cos 2\pi(F_o + F)t + \tfrac{1}{2} \cos 2\pi(F_o - F)t\} + \cos 2\pi F_o t \cdot H\{\tfrac{1}{2} \sin 2\pi(F_o + F)t + \tfrac{1}{2} \sin 2\pi(F_o - F)t\}.$$

The Hilbert transforms of sinusoids (see Bracewell, R., 1965, The Fourier Transform and Its Application: New York, McGraw-Hill Book Co., Inc.) are:

$$H\{\sin \alpha\} = \begin{cases} \cos \alpha, & \alpha > 0 \\ -\cos \alpha, & \alpha < 0 \end{cases}$$

$$H\{\cos \alpha\} = \begin{cases} -\sin \alpha, & \alpha > 0 \\ \sin \alpha, & \alpha < 0. \end{cases}$$

Hence, for y(t), $$y(t) = \begin{cases} -\sin 2\pi F_o t \{-\tfrac{1}{2} \sin 2\pi(F_o + F)t - \tfrac{1}{2} \sin 2\pi(F_o - F)t\} + \cos 2\pi F_o t \{\tfrac{1}{2} \cos 2\pi(F_o + F)t + \tfrac{1}{2} \cos 2\pi(F_o - F)t\}, & F_o - F > 0 \\ -\sin 2\pi F_o t \{-\tfrac{1}{2} \sin 2\pi(F_o + F)t + \tfrac{1}{2} \sin 2\pi(F_o - F)t\} + \cos 2\pi F_o t \{\tfrac{1}{2} \cos 2\pi(F_o + F)t - \tfrac{1}{2} \cos 2\pi(F_o - F)t\}, & F_o - F < 0. \end{cases}$$

The above reduces to $$y(t) = \begin{cases} -\tfrac{1}{4} \cos 2\pi(2F_o + F)t + \tfrac{1}{4} \cos 2\pi(-F)t - \\ \qquad \tfrac{1}{4} \cos 2\pi(2F_o - F) + \tfrac{1}{4} \cos 2\pi F t \\ +\tfrac{1}{4} \cos 2\pi(2F_o + F)t + \tfrac{1}{4} \cos 2\pi(-F)t + \\ \qquad \tfrac{1}{4} \cos 2\pi(2F_o - F)t + \tfrac{1}{4} \cos 2\pi F t \\ F_o - F > 0 \\ \\ -\tfrac{1}{4} \cos 2\pi(2F_o + F)t + \tfrac{1}{4} \cos 2\pi(-F)t + \\ \qquad \tfrac{1}{4} \cos 2\pi(2F_o - F)t - \tfrac{1}{4} \cos 2\pi F t \\ +\tfrac{1}{4} \cos 2\pi(2F_o + F) + \tfrac{1}{4} \cos 2\pi(-F)t - \\ \qquad \tfrac{1}{4} \cos 2\pi(2F_o - F)t - \tfrac{1}{4} \cos 2\pi F t \\ F_o - F < 0 \end{cases}$$

and $$y(t) = \begin{cases} \cos 2\pi F t, & F_o - F > 0 \\ 0, & F_o - F < 0. \end{cases}$$

Hence, an input cosine wave with frequency less than that of the control function will pass through the filter without change. (A similar property exists for a sine function). A cosine or sine function with frequency greater than that of the control function is rejected. Therefore, on the basis of the above derivation, an elementary Hilbert transform filter operates as a high-cut filter.

In the above derivation, frequencies as high as twice the control function plus the input signal frequency are present. Since frequency components above the Nyquist frequency will distort back below Nyquist frequency (see Kanasewich, E. R., 1973, Time Sequence Analysis in Geophysics: Edmonton, Univeristy of Alberta Press, p. 84), the input signal to a Hilbert transform filter should not contain frequencies higher than half Nyquist, for example, 125 Hz under circumstances where the input signal is sampled at a sampling interval of 0.002 second. Otherwise, the output signal will be distorted.

Figure 2:
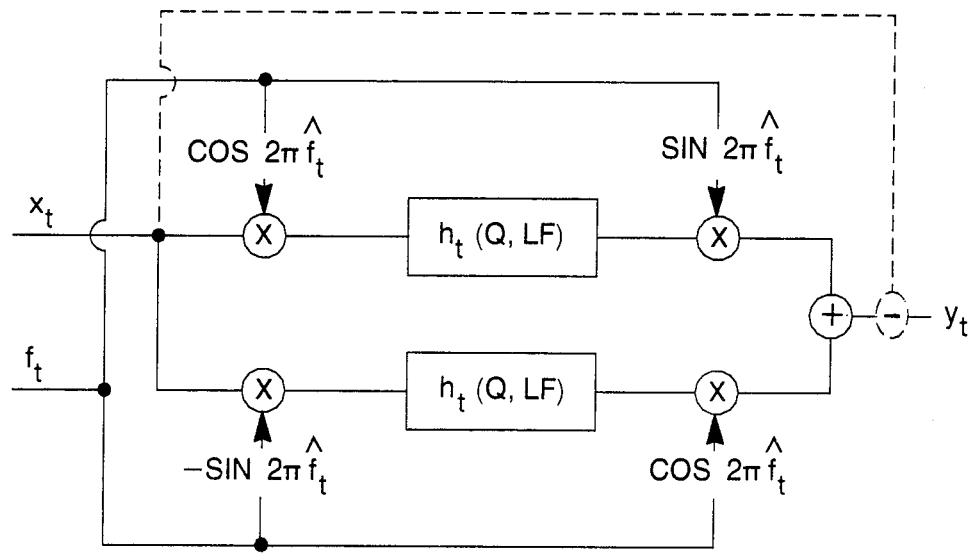
FIG. 2 is a block diagram of a digital time-variant Hilbert transform filter in accordance with the invention.

FIG. 2 shows a block diagram for a digital time-variant Hilbert transform filter in accordance with a preferred embodiment of the invention where $x_t$ is the digitized input electrical signal to be filtered and $y_t$ is the digital output electrical signal. A digital time-varying control function $f_t$ also forms an input which provides a variable cutoff frequency. Frequency cutoff $f_t$ is selectively defined and is input as shown along with Hilbert transform operator parameters Q (strength of weighting) and LF (length of Hilbert transform operator). (The digital time-variant Hilbert transform filter block diagram shown in FIG. 2 appears similar to that for the Weaver SSB (single-sideband) modulator disclosed in Freeny, S. L., Kaiser, J. F., and McDonald, H. S., 1978, Some Applications of Digital Signal Processing in Telecommunications, in Applications of Digital Signal Processing: A. V. Oppenheim, ed., Englewood Cliffs, Prentice-Hall, Inc., p. 9).

The input parameters of Hilbert transform operator length, LF, and strength of weighting, Q, are determined as follows. In order that these input parameters can be determined, the frequency response of the digital time-variant Hilbert transform filter as diagrammed in FIG. 2 are analyzed in order to derive empirical equations which relate filter frequency characteristics to the various filter input parameters. In accordance with the present invention, the specific characteristics of interest in the frequency domain are roll-off interval and reject-zone attenuation.

Control function $f_t$ in FIG. 2 is initially set to constant $F_o$, that is, the digital Hilbert transform filter is rendered time-invariant. This is so that Fourier analysis (inherently time-invariant) can be accurately applied.

The use of weight functions in Finite Impulse Response (FIR) design techniques is discussed by many authors, for example, Rabiner, L. R., and Gold, B., 1975, Theory and Application of Digital Signal Processing: Englewood Cliffs, Prentice-Hall, Inc., p. 88. The applicable family of weight functions is given by Ross, D. T., 1954, Improved Computational Techniques for Fourier Transformation: M.I.T. Servomechanisms Lab. Rep. No. 7138-R-5, and is defined by:

$$w_k(Q,LF) = [1 - k/K^2])^Q, \; k = 0, \pm 1, \ldots, \pm K, \quad (1)$$

where operator length LF is $2K+1$ and exponent Q controls the degree of weighting.

Figure 3:
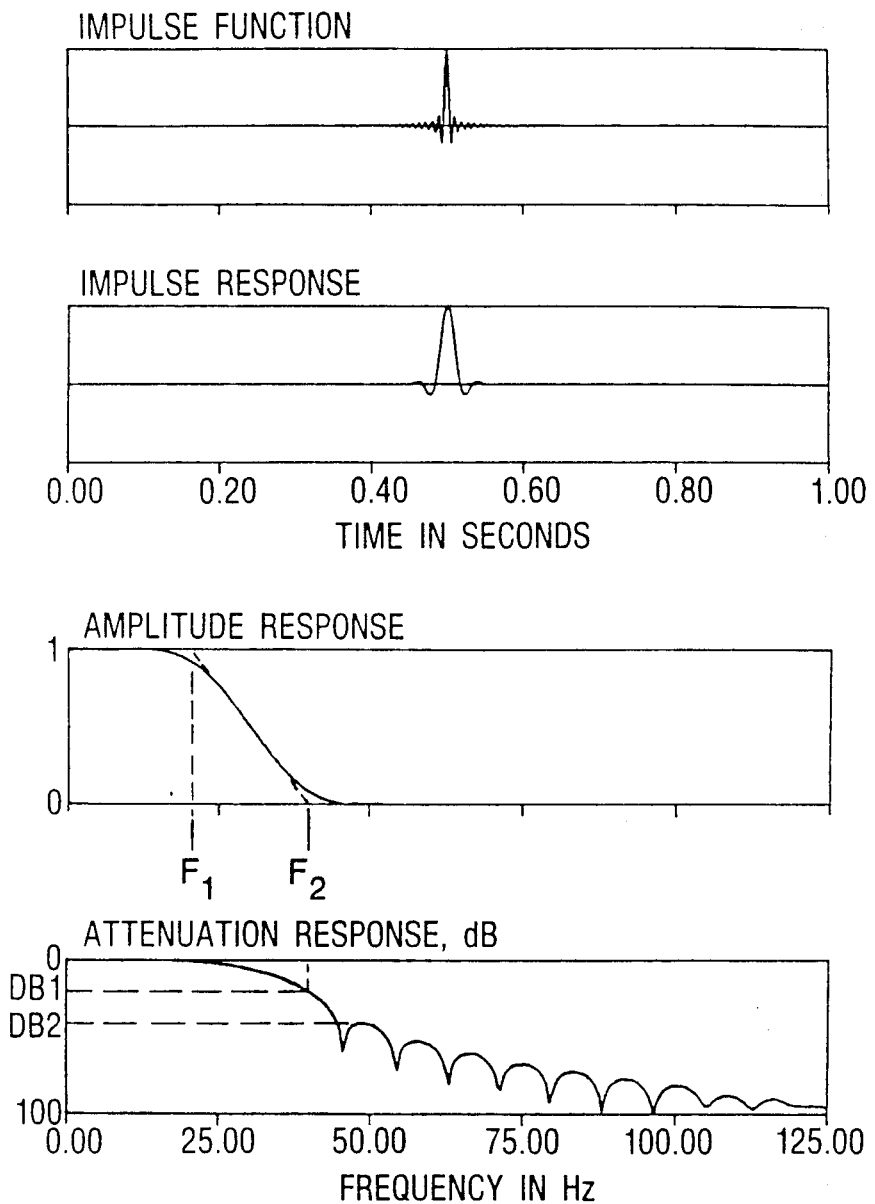
FIG. 3 illustrates the impulse response of the filter shown in FIG. 2.

FIG. 3 illustrates the impulse response of the filter shown in FIG. 2 for the case of a constant cutoff frequency $F_o$ equal to 30 Hz, Hilbert transform strength of weighting Q equal to 3, and Hilbert transform operator length LF equal to 61 samples. As indicated above, the input signal to be filtered preferably does not contain frequencies higher than $1/(4\Delta t)$, where $\Delta t$ is the sampling interval. Hence, the impulse function $i_t$ is a scaled sinc function as modified by an appropriate weight function, viz.:

$$i_t \approx \frac{\sin \frac{\pi k}{2}}{2\pi k (\alpha t)^2},$$

where $\Delta t = 0.002$ second. If the slope of the amplitude response at $F_o$ (30 Hz) is extended, the line intersects unit response at about 21 Hz and zero response at about 39 Hz. Following Ormsby, J. F. A., 1960, Design of Numerical Filters With Applications to Missile Data Processing: Los Angeles, Space Technology Laboratories, Inc., Rep. No. STL/TR-60-0000-09123, these frequency values are called $F_1$ and $F_2$, respectively. Also, roll-off interval $\Delta F$ is defined to be $F_2 - F_1$.

The following general characteristics can be observed from FIG. 3: (1) the amplitude response is ½ (6 dB down) at $F_o$; and (2) the response at $F_1$ is about 0.90 (0.10 less than unity) and that at $F_2$ is about 0.10 (20 dB down). Also, the following characteristics for the particular Hilbert transform filter are noted: (1) roll-off interval $\Delta F$ is 18 Hz; and (2) after the attenuation response dips to the first null, it rises again to the maximum response in the reject zone. This minimum rejection value is called DB2 and is about 45 dB.

Letting Q, LF, and $F_o$ take on a variety of values and repeating the above procedure, the data in Table 1 is obtained. The column headings for Table 1 are defined as follows: Q is the Hilbert transform strength of weighting (see Equation (1)). LF is the Hilbert transform operator length in samples (the sampling interval is 0.002 second). $F_o$ is the cutoff frequency in Hz. $F_1$ is the frequency for which a straight line extension of the slope near $F_o$ intersects unit response. $F_2$ is the frequency where the above line intersects zero response. WF is the roll-off interval $F_2 - F_1$. DB1 is the attenuation in dB at frequency $F_2$. DB2 is the minimum reject-zone attenuation. $AV_{DB2}$ is the average of the DB2 values for all runs with a given Q. LF"WF is the product of LF and WF. $AV_{LF \cdot WF}$ is the average product for a given Q. The last column is the ratio of the average product to the average minimum reject-zone attenuation.

TABLE 1

SUMMARY OF HILBERT TRANSFORM FILTER PERFORMANCE CHARACTERISTICS. SAMPLE INCREMENT IS .002 SEC.

| Q | LF | $F_O$ | $F_1$ | $F_2$ | $\Delta F$ | DB1 | DB2 | $AV_{DB2}$ | LF · $\Delta F$ | $AV_{LF \cdot \Delta F}$ | $\frac{AV_{LF \cdot \Delta F}}{AV_{DB2}}$ |
|---|---|---|---|---|---|---|---|---|---|---|---|
| 0. | 61 | 30. | 25.94 | 34.06 | 8.12 | 23.21 | 19.88 | | 495.26 | | |
| 0. | 61 | 60. | 55.69 | 64.31 | 8.62 | 21.26 | 21.23 | | 526.01 | | |
| 0. | 121 | 30. | 27.86 | 32.14 | 4.27 | 21.55 | 21.32 | | 517.14 | | |

TABLE 1-continued
SUMMARY OF HILBERT TRANSFORM FILTER PERFORMANCE CHARACTERISTICS. SAMPLE INCREMENT IS .002 SEC.

| Q | LF | $F_O$ | $F_1$ | $F_2$ | $\Delta F$ | DB1 | DB2 | $AV_{DB2}$ | $LF \cdot \Delta F$ | $AV_{LF \cdot \Delta F}$ | $\dfrac{AV_{LF \cdot \Delta F}}{AV_{DB2}}$ |
|---|---|---|---|---|---|---|---|---|---|---|---|
| 0. | 121 | 60. | 57.89 | 62.11 | 4.22 | 21.94 | 20.67 | 20.77 | 510.21 | 512.16 | 24.65 |
| 1. | 61 | 30. | 23.72 | 36.28 | 12.56 | 20.57 | 31.21 | | 766.09 | | |
| 1. | 61 | 60. | 53.75 | 66.25 | 12.51 | 20.60 | 31.41 | | 763.01 | | |
| 1. | 121 | 30. | 26.87 | 33.13 | 6.25 | 20.58 | 31.43 | | 756.81 | | |
| 1. | 121 | 60. | 56.87 | 63.13 | 6.26 | 20.59 | 31.39 | 31.36 | 757.13 | 760.76 | 24.26 |
| 2. | 61 | 30. | 22.17 | 37.83 | 15.65 | 19.97 | 38.97 | | 954.83 | | |
| 2. | 61 | 60. | 52.18 | 67.82 | 15.63 | 19.99 | 39.08 | | 953.72 | | |
| 2. | 121 | 30. | 26.09 | 33.91 | 7.82 | 18.54 | 39.10 | | 946.01 | | |
| 2. | 121 | 60. | 56.09 | 63.91 | 7.82 | 18.54 | 39.09 | 39.06 | 946.15 | 950.18 | 24.33 |
| 3. | 61 | 30. | 20.88 | 39.12 | 18.24 | 20.30 | 45.45 | | 1112.47 | | |
| 3. | 61 | 60. | 50.88 | 69.12 | 18.24 | 20.30 | 45.48 | | 1112.76 | | |
| 3. | 121 | 30. | 25.44 | 34.56 | 9.12 | 20.30 | 45.63 | | 1103.64 | | |
| 3. | 121 | 60. | 55.44 | 64.56 | 9.12 | 20.30 | 45.62 | 45.54 | 1103.65 | 1108.13 | 24.33 |
| 4. | 61 | 30. | 19.74 | 40.26 | 20.52 | 19.83 | 51.27 | | 1251.50 | | |
| 4. | 61 | 60. | 49.74 | 70.26 | 20.52 | 19.83 | 51.29 | | 1251.71 | | |
| 4. | 121 | 30. | 24.87 | 35.13 | 10.26 | 19.83 | 51.31 | | 1241.46 | | |
| 4. | 121 | 60. | 54.87 | 65.13 | 10.26 | 19.83 | 51.31 | 51.30 | 1241.46 | 1246.53 | 24.30 |
| 5. | 61 | 30. | 18.72 | 41.28 | 22.57 | 19.71 | 56.59 | | 1376.77 | | |
| 5. | 61 | 60. | 48.72 | 71.28 | 22.57 | 19.71 | 56.60 | | 1376.73 | | |
| 5. | 121 | 30. | 24.36 | 35.64 | 11.28 | 19.71 | 56.61 | | 1365.46 | | |
| 5. | 121 | 60. | 54.36 | 65.64 | 11.29 | 19.71 | 56.59 | 56.60 | 1365.49 | 1371.11 | 24.23 |
| 6. | 61 | 30. | 17.78 | 42.22 | 24.45 | 19.76 | 61.58 | | 1491.44 | | |
| 6. | 61 | 60. | 47.78 | 72.22 | 24.45 | 19.76 | 61.60 | | 1491.38 | | |
| 6. | 121 | 30. | 23.89 | 36.11 | 12.22 | 19.76 | 61.59 | | 1479.16 | | |
| 6. | 121 | 60. | 53.89 | 66.11 | 12.22 | 19.76 | 61.57 | 61.59 | 1479.18 | 1485.29 | 24.12 |
| 7. | 61 | 30. | 16.90 | 43.10 | 26.19 | 19.91 | 66.34 | | 1597.83 | | |
| 7. | 61 | 60. | 46.90 | 73.10 | 26.19 | 19.91 | 66.36 | | 1597.83 | | |
| 7. | 121 | 30. | 23.45 | 36.55 | 13.10 | 19.91 | 66.35 | | 1584.75 | | |
| 7. | 121 | 60. | 53.45 | 66.55 | 13.10 | 19.91 | 66.35 | 66.35 | 1584.77 | 1591.29 | 23.98 |
| 8. | 61 | 30. | 16.09 | 43.91 | 27.83 | 19.41 | 70.90 | | 1697.60 | | |
| 8. | 61 | 60. | 46.08 | 73.92 | 27.83 | 19.41 | 70.96 | | 1697.66 | | |
| 8. | 121 | 30. | 23.04 | 36.96 | 13.92 | 18.70 | 70.91 | | 1683.72 | | |
| 8. | 121 | 60. | 53.04 | 66.96 | 13.92 | 18.70 | 70.90 | 70.92 | 1683.74 | 1690.68 | 23.84 |
| 9. | 61 | 30. | 15.31 | 44.69 | 29.37 | 19.71 | 75.32 | . | 1791.86 | | |
| 9. | 61 | 60. | 45.31 | 74.69 | 29.38 | 19.71 | 75.43 | | 1791.91 | | |
| 9. | 121 | 30. | 22.66 | 37.34 | 14.69 | 19.03 | 75.29 | | 1777.20 | | |
| 9. | 121 | 60. | 52.66 | 67.34 | 14.69 | 19.03 | 75.30 | 75.34 | 1777.22 | 1784.55 | 23.69 |
| 10. | 61 | 30. | 14.58 | 45.42 | 30.84 | 19.38 | 79.61 | | 1881.43 | | |
| 10. | 61 | 60. | 44.58 | 75.42 | 30.84 | 19.38 | 79.38 | | 1881.46 | | |
| 10. | 121. | 30. | 22.29 | 37.71 | 15.42 | 19.38 | 79.60 | | 1866.04 | | |
| 10. | 121 | 60. | 52.29 | 67.71 | 15.42 | 19.38 | 79.63 | 79.56 | 1866.04 | 1873.74 | 23.55 |
| 11. | 61 | 30. | 13.88 | 46.12 | 32.25 | 19.75 | 83.89 | | 1966.95 | | |
| 11. | 61 | 60. | 43.88 | 76.12 | 32.24 | 19.75 | 83.25 | | 1966.91 | | |
| 11. | 121 | 30. | 21.94 | 38.06 | 16.12 | 19.75 | 83.76 | | 1950.80 | | |
| 11. | 121 | 60. | 51.94 | 68.06 | 16.12 | 19.75 | 83.85 | 83.69 | 1950.85 | 1958.88 | 23.41 |
| 12. | 61 | 30. | 13.21 | 46.79 | 33.59 | 19.52 | 87.90 | | 2048.88 | | |
| 12. | 61 | 60. | 43.21 | 76.79 | 33.59 | 19.52 | 86.90 | | 2048.85 | | |
| 12. | 121 | 30. | 21.60 | 38.40 | 16.79 | 18.94 | 87.78 | | 2032.02 | | |
| 12. | 121 | 60. | 51.60 | 68.40 | 16.79 | 18.94 | 88.13 | 87.68 | 2032.07 | 2040.45 | 23.27 |

The following general characteristics are observed from the data in Table 1: (1) $\Delta F$ does not vary with $F_o \cdot \Delta t$; (2) DB1 tends to be a constant of about 20 dB; and (3) the ratio of product $LF \cdot \Delta t$ to DB2 tends to be a constant of about 24. Two important and accurate empirical equations emerge from the data in Table 1 as will now be described.

Figure 4:
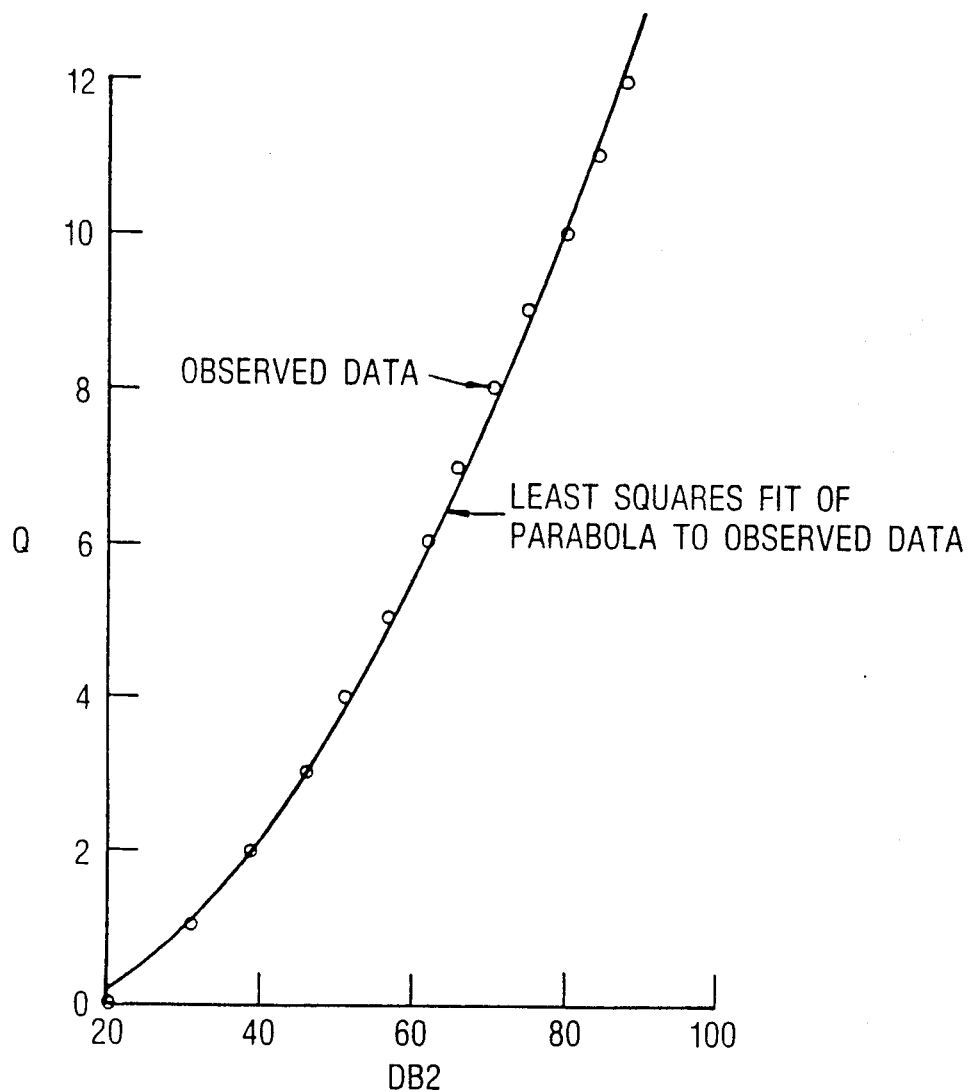
FIG. 4 shows the variation of the minimum reject-zone attenuation (DB2) with strength of weighting (Q) for the filter shown in FIG. 2 in the form of a discrete curve.

With regard to determination of the Hilbert transform strength of weighting, Q, as a function of attenuation, Table 1 evidences that DB2 tends to be independent of both LF and $F_o$ but varies with Q. The variation of DB2 with Q is shown in FIG. 4 in the form of a discrete curve. A least-squares fit of the data to a parabola produces the following relationship between minimum reject-zone attenuation DB2 and Q:

$$Q = 0.001657 \, DB2^2 - 0.4712. \tag{2}$$

Equation (2) is sketched in FIG. 4 as a continuous curve. Note that there is a close agreement between the continuous and discrete data. Hence, Equation (2) allows predetermination of the attenuation characteristic for the digital time-variant Hilbert transform filters of the invention.

With regard to determination of the Hilbert transform operator length, LF, as a function of roll-off interval and attenuation, Table 1 demonstrates that product $\Delta F \cdot LF$ tends to be constant for a given value of Q but the product varies with Q. (This proportionality between LF and $\Delta F$ is also noted by Meyerhoff, H. J., 1968, Realization of Sharp Cut-Off Frequency Characteristics on Digital Computers, Part 1: Geophysical Prospecting, v. 16, pp. 208–219, at page 217, for a high-cut filter). Furthermore, the quantity $(\Delta F \cdot LF)/DB2$ tends to have a constant value of 24. Hence, LF can be expressed in terms of minimum reject-zone attenuation DB2 and roll-off interval $\Delta F$ as follows:

$$LF = \frac{24 \, DB2}{\Delta F}.$$

Allowing for a variable sampling interval:

$$LF = \frac{.048 \, DB2}{\Delta F \, \Delta t}. \qquad (3)$$

Equation (3) allows predetermination of the Hilbert transform operator length that is needed to obtain specified roll-off interval ΔF and minimum reject-zone attenuation DB2. Smaller roll-off interval values (sharper filter) require greater length, and higher rejection values require greater length.

The Hilbert transform filter parameters are determined only once prior to filtering. That is, determination of the Hilbert transform filter is not performed as a part of the actual filtering of the input electrical signal but is made beforehand.

Having determined the input parameters for the Hilbert transform operator length, LF, and strength of weighting, Q, the digital time-variant Hilbert transform filters of the invention can be fully specified once a digital time-varying control function $f_t$ is selected. The control function can be either discrete or analytical. If discrete, however a discrete integration technique such as that given by Peacock, K. L., 1979, An Optimum Filter Design for Discrete Integration: Geophysics, v. 44, pp. 722–729, is preferably used as shown in FIG. 2.

The data processing of the invention can be practiced using several well known types of computing apparatus. It is particularly suitable for use with a general purpose digital computer. One particular computing system used in practicing the method is supplied by International Business Machines, Inc., under the general model designation 370/158.

While the invention can be implemented by various programs, one suitable program predominantly specified in the FORTRAN language (IBM FORTRAN IV), useful on practically all digital computers, is given below. For a better understanding of the use of FORTRAN statements, reference can be made to Plumb, S. C., Introduction to FORTRAN: New York, McGraw-Hill Book Co., Inc., An IBM compiler G or H can be used in conjunction with the program.

The following is a FORTRAN listing for subprogram HILHC3, a subroutine that will construct and apply the high-cut digital time-variant Hilbert transform filter of the invention. Other necessary subroutines are FOLD (disclosed in Robinson, E. A., 1967, Multichannel Time Series Analysis With Digital Computer Programs: San Francisco, Holden-Day), HILF and INTD (the latter two disclosed in Peacock, K. L., 1977, The Design of Discrete Nonadaptive Operators for Seismic Data Processing: Ph.D Dissertation, University of Tulsa).

FORTRAN Listing of Subroutine HILHC3

```
SUBROUTINE HILHC3(LX,X,TDEL,BAND,NFILT,DB,LFMAX,FREQ,F,BUF2,BUF3,BUF4,IERR,LF,Y)
MODIFIED TO ALLOW INPUT INSTANTANEOUS FREQUENCY, THIS VERSION OF HILHC ALSO ACCEPTS AS INPUT THE DESIRED ROLL OFF INTERVAL AND THE DESIRED ATTENUATION VALUE. HILHC3 HIGHCUT FILTERS THE INPUT SIGNAL VIA THE HILBERT TRANSFORM OPERATOR. CUTOFF FREQUENCY IS SPECIFIED CONTINUOUSLY BY INPUT ARRAY FREQ. NOTE THAT INPUT X IS DESTROYED AND INPUT FREQ IS SUBSEQUENTLY USED AS A BUFFER. BUFFERS F, FREQ AND BUF2 MUST NOT BE DISTURBED BETWEEN CALLS UNLESS FILTER IS RECOMPUTED.
INPUTS ARE ...
   LX, LENGTH OF X ARRAY.
   X, THE INPUT ARRAY.
   TDEL, SAMPLE INCREMENT, IN SECONDS.
      NOTE THAT THE HIGHEST FREQUENCY PERMITTED IN THE INPUT IS ½ NYQUIST.
      THAT IS, THE DATA MUST NOT HAVE FREQUENCY CONTENT IN THE UPPER HALF RANGE.
   BAND, ROLLOFF INTERVAL, IN HERTZ.
   NFILT, NEW FILTER CODE, 1=NEW FILTER.
   DB, MINIMUM REJECTION FOR THE REJECT BAND, IN DB.
      DB.LE.20 PRODUCES A FILTER WITH DB ABOUT 20.
      A CONVENTIONAL ORMSBY FILTER WITH ROSS
      EXPONENT 3 AND LENGTH 200 MS. HAS A FIGURE OF
      ABOUT 63 DB.
   LFMAX, MAXIMUM LENGTH FOR HILBERT TRANSFORM OPERATOR, IN SAMPLES.
INPUT/BUFFER IS ...
   FREQ, LX-LENGTH INSTANTANEOUS FREQUENCY ARRAY, SUBSEQUENTLY USED AS BUFFER.
BUFFERS ARE ...
   F, LFMAX-LENGTH BUFFER.
   BUF2, LX-LENGTH BUFFER.
   BUF3, LX+LFMAX-1 LENGTH BUFFER.
   BUF4, LX+LFMAX-1 LENGTH BUFFER.
OUTPUTS ARE ...
   IERR, ERROR CODE. IERR.EQ.1 MEANS FILTER LENGTH LONGER THAN LFMAX IS REQUIRED. INCREASE LFMAX, INCREASE BAND OR DECREASE DB AND RUN AGAIN.
   LF, LENGTH OF HILBERT TRANSFORM OPERATOR.
   Y, THE LX-LENGTH OUTPUT SIGNAL.
PROGRAMMED FOR THE IBM 370/158 COMPUTER.
VERSION AS OF 5-25-79.
      DIMENSION X(1),F(1),FREQ(1),BUF2(1),BUF3(1),BUF4(1),Y(1)
      DIMENSION A(31)
      IF(NFILT.NE.1) GO TO 2
      FACT=2.*3.1415927
      CALL INTD(LX,FREQ,1,TDEL,3,31,A,BUF2)
      IERR=0
      EX=0.00165/*DB*DB−0.4712
      IF(EX.LT.0.)EX=0.
      TERM=0.048*DB
      LF=TERM/BAND/TDEL
      LF=LF/2*2+1
      IF(LF.GT.LFMAX) GO TO 100
      CALL HILF(TDEL,EX,LF,F)
      DO 5 I=1, LX
      FREQ(I)=COS (FACT*BUF2(I))
    5 BUF2(I)=SIN (FACT*BUF2(I))
    2 DO 3 I=1, LX
      Y(I)=X(I)*FREQ(I)
    3 X(I)=X(I)*BUF2(I)
      CALL FOLD (LX,Y,LF,F,LY,BUF3)
```

```
CALL FOLD(LX,X,LF,F,LY,BUF4)
      JFACT=LF/2
      DO 4 I=1, LX
      J=I+JFACT
4           Y(I)=(-BUF2(I)*BUF3(J)+FREQ(I)*
     BUF4(J))*TDEL
99    RETURN
100   IERR=1
      GO TO 99
      END
```

The following comments refer to the program listing above. The statements contained in the program listing have the following interpretations:

Statement 1—Normally required dimension statement.
Statement 2—Dimension of buffer for subroutine INTD.
Statement 3—Flag check to determine whether or not Hilbert transform operator needs to be computed and initial computations made on the control function.
Statement 4—Definition of $2\pi$ constant.
Statement 5—Call to subroutine INTD which integrates control function.
Statement 6—Initial setting of error code to 0.
Statement 7—Definition of Hilbert transform strength of weighting in terms of minimum reject-zone attenuation.
Statement 8—Precaution to assure EX is greater than or equal to 0.
Statements 9, 10, 11—Definition of Hilbert transform operator length.
Statement 12—Test to determine whether or not Hilbert transform operator length is acceptable.
Statement 13—Call to subroutine HILF which constructs Hilbert transform operator.
Statements 14, 15, 16—Do loop to form sine and cosine arrays from the control function.
Statements 17, 18, 19—Do loop to form products between input signal and the sinusoidal arrays.
Statements 20, 21—Call to subroutine FOLD which convolves above product arrays with the Hilbert transform operator.
Statement 22—Definition of shift index to remove lag due to above convolutions.
Statements 23, 24, 25—Do loop to form final product arrays between sinusoidal arrays and product arrays from Statements 17, 18, 19.
Statement 26—Normally required return statement.
Statement 27—Error code set to 1 when test in Statement 12 indicates unacceptable Hilbert transform operator length.
Statement 28—Direction to exit from error setting.
Statement 29—Normally required end statement.

For a test case, let the control function be given by:

$$F_k = 80e^{-0.69315\,k\Delta t},\ k=0, 1, \ldots, 1000,$$

integrated discretely. The above instantaneous frequency function has a value of 80 Hz at zero time, a value of 40 Hz at one second, and a value of 20 Hz at two seconds.

Figure 5:
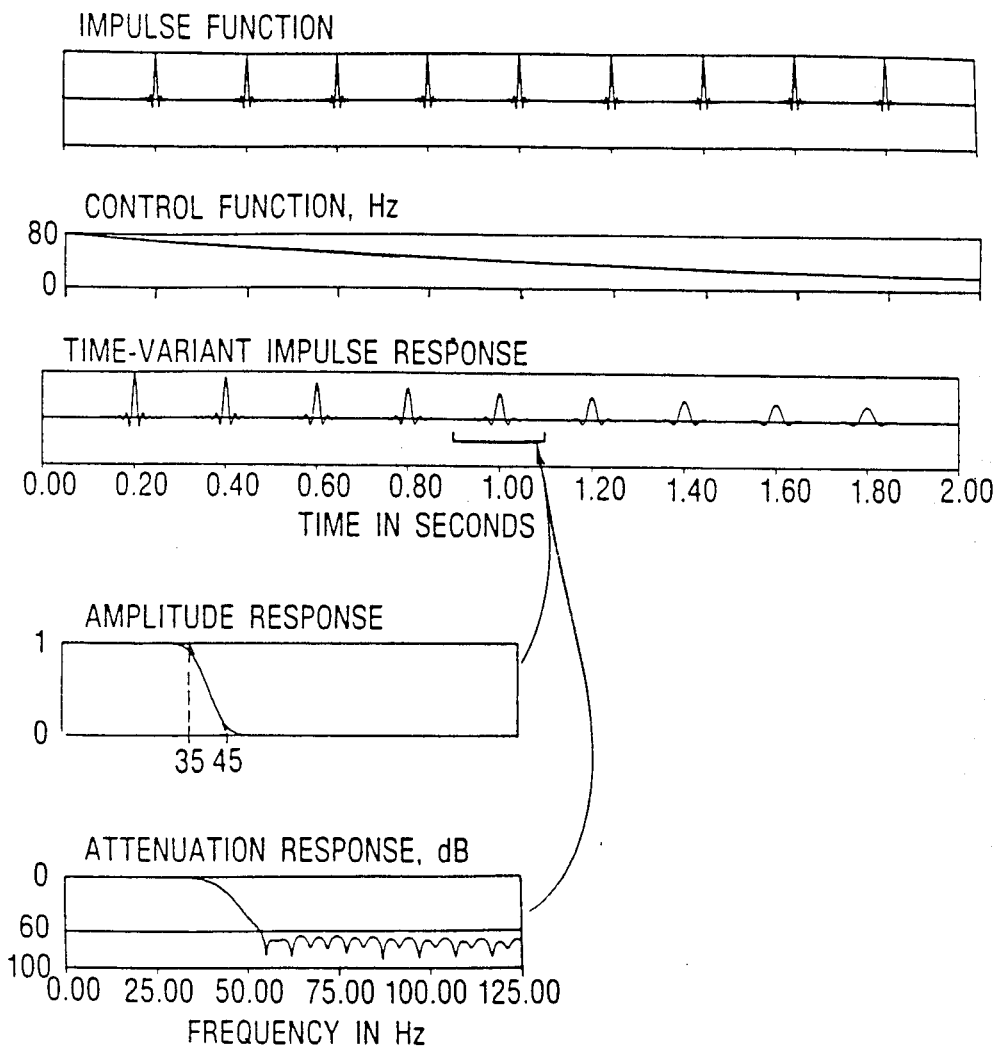
FIG. 5 illustrates an impulse function input signal comprising a series of invariant functions for the filter shown in FIG. 2.

An impulse function input signal for the high-cut digital time-variant Hilbert transform filter of the invention can be made up of a series of invariant functions as illustrated in FIG. 5. As was the case for the time-invariant filter used to determine the input parameters for the Hilbert transform strength of weighting, Q, and operator length, LF, the input signal to be filtered preferably contains no frequency components above half the Nyquist frequency. Hence, the time-variant impulse function comprises repeated "pseudo-delta" functions. Each pseudo-delta function is similar to that shown in FIG. 3.

FIG. 5 shows the output signal (time-variant impulse response) for the impulse function input signal. FIG. 5 demonstrates a very stable and predictable response characteristic. (Minimum reject-zone attenuation DB2 is 60 dB and roll-off interval WF is 10 Hz.)

Figure 6:
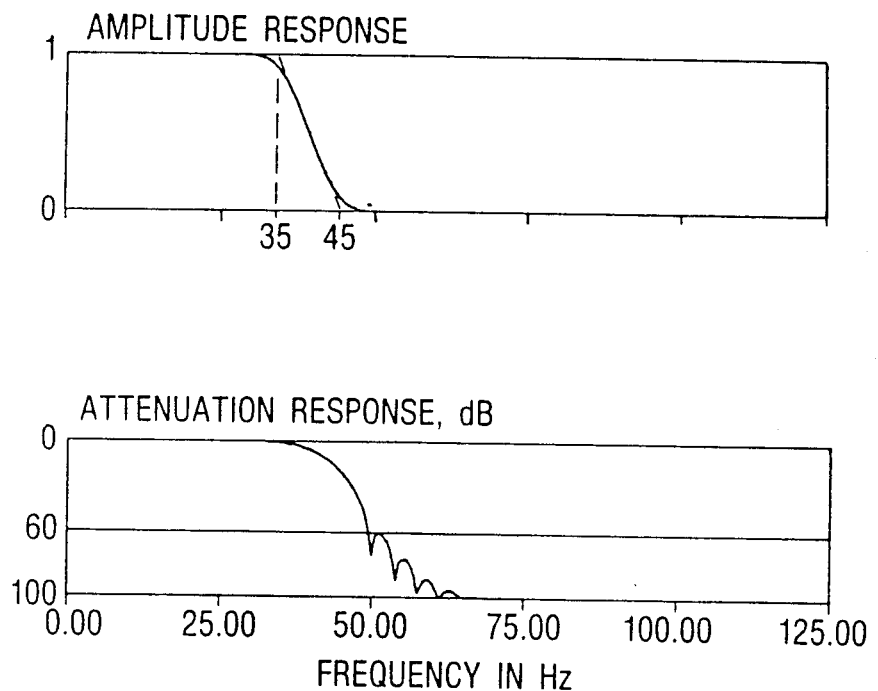
FIG. 6 shows the amplitude and attenuation responses where a time-invariant filter with a cutoff frequency ($F_o$) equal to 40 Hz is analyzed.

The amplitude spectrum of FIG. 5 corresponds to the event centered at one second. Recall that the control function has a value of 40 Hz at this time. Hence, $F_1$ is expected to be 35 Hz, and $F_2$ is expected to be 45 Hz. The observed response is close to that expected; however, attenuation in the reject zone is not as clean as that for the time-invariant filter analyzed in FIG. 3. This is due to two factors: (1) the time-variant filter is changing cutoff value across the 0.2 second "window," or period, of analysis; and (2) the individual events in the output signal are longer than 0.2 second, and therefore, some truncation has occurred. By way of comparison, FIG. 6 shows the amplitude and attenuation responses where a time-invariant filter with $F_o$ equal to 40 Hz is analyzed (the filter otherwise has identical parameters). The response behaves according to specifications, that is, $F_1 = 35$ Hz, $F_2 = 45$ Hz, and DB2 = 60 dB.

Since the digital Hilbert transform filters of the invention are truly time-variant, whereas Fourier transforms are inherently time-invariant, some difficulty is encountered in accurately evaluating the time-variant amplitude spectrum of the filters of the invention. However, a short-window-transform type of harmonic analysis can be computed as is done in speech processing (see Oppenheim, A. V., 1970, Speech Spectrograms Using the Fast Fourier Transform: IEEE Spectrum, v. 7, no. 8, pp. 57–62). After the initial transform computation, subsequent transforms, one time unit apart, can be constructed by recursion ("add a point, drop a point"). Furthermore, any needed smoothing can be done in the frequency domain by successive applications of a Hanning three-point operator (see Blackman, R. B., and Tukey, J. W., The Measurement of Power Spectra: New York, Dover Publications, Inc., p. 34). Hence, a pseudo-time-variant transform can be derived that is quite fast irrespective of the technique used for the initial computation (that is, whether a "Fast Fourier Transform" or a conventional transform is used).

Figure 7A:
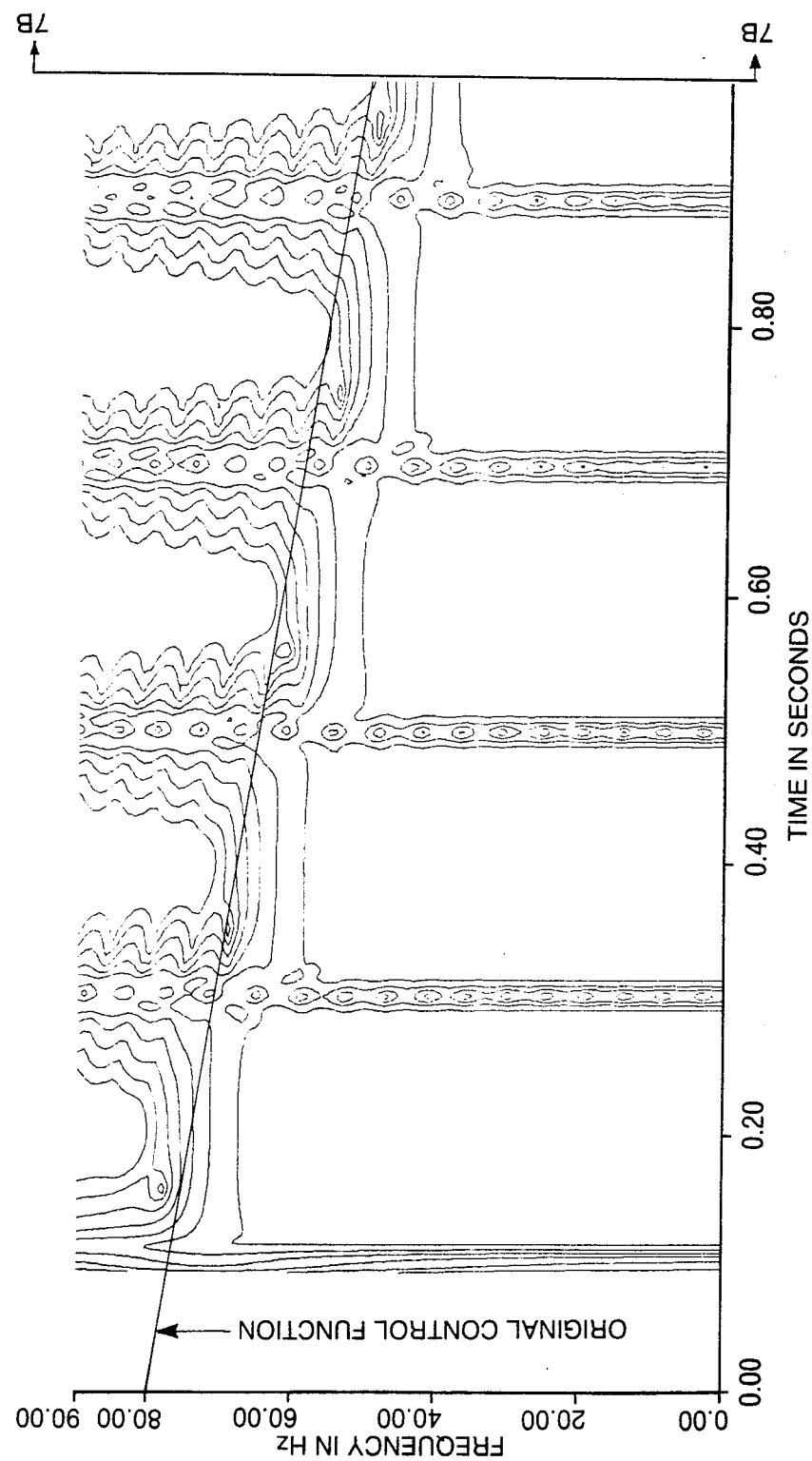
FIGS. 7A and 7B illustrate a spectrum for the test of the filter shown in FIG. 2 representing the time-variant attenuation response for the impulse response in FIG. 5. The control function intersects the 6 dB-down contour.
Figure 7B:
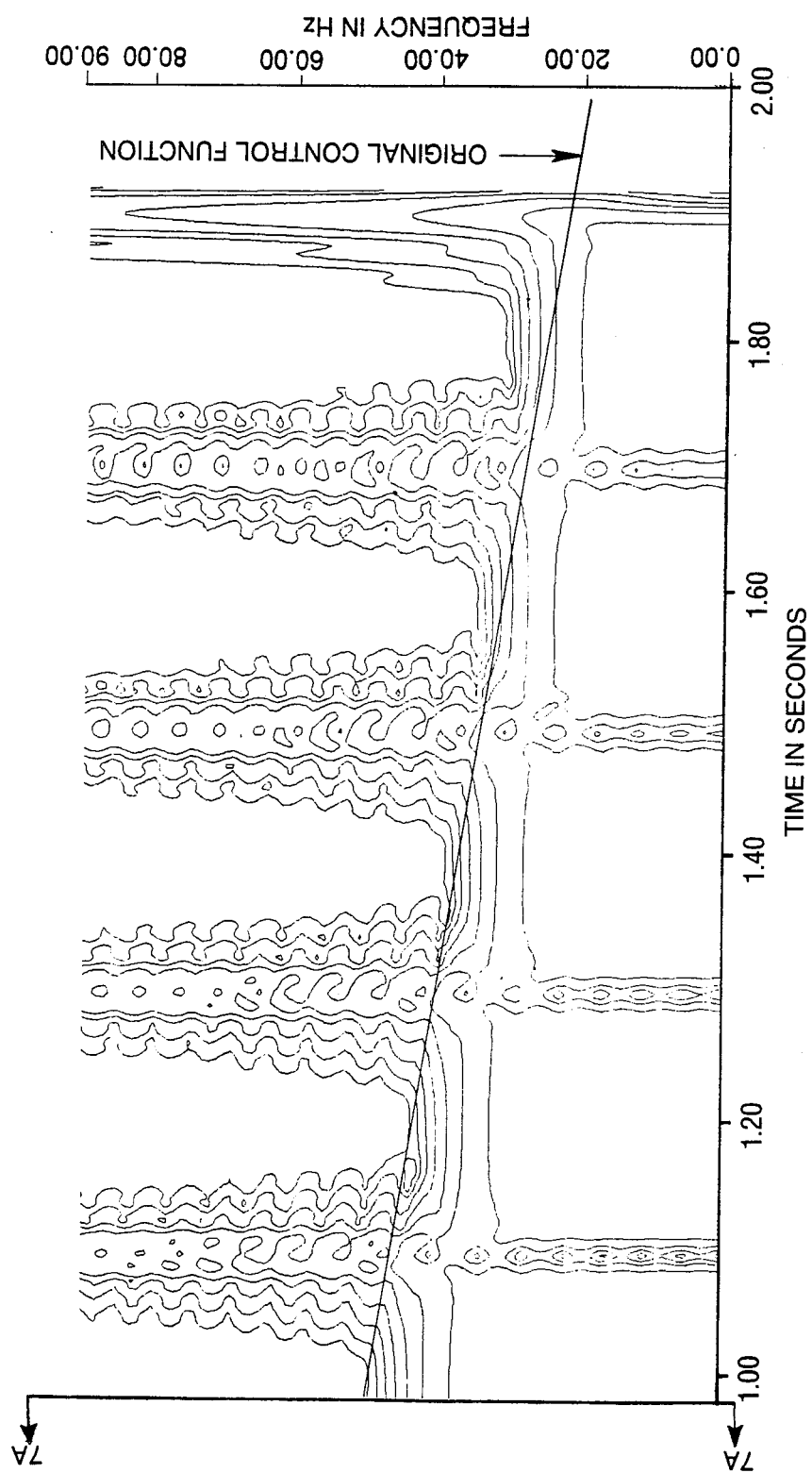

Such a spectrum or time-variant attenuation response for the test of the high-cut digital time-variant Hilbert transform filter of the invention is displayed in FIGS. 7A and 7B which are a contour graph where each contour represents 3 dB from 3 to 46 dB. Recall that the individual impulses of the impulse function input signal are spaced 0.2 second apart. Hence, the lines at 0.10, 0.30, etc., are window noise. The heavy exponential line is the original control function. This line intersects the 6 dB-down contour at each individual impulse location. That is, the measured cutoff values are precisely as expected.

Consequently, implementation of the digital time-variant Hilbert transform filters of the invention on the basis of FIR using the Ross weight family is verified. Empirical Equations (2) and (3) therefore provide the Ross weight exponent and operator length that are needed to achieve the desired attenuation and roll-off characteristics.

The above example relates to an analysis of a high-cut digital time-variant Hilbert transform filter in accordance with the invention. The high-cut filter can be converted into a low-cut filter by subtracting the high-cut output signal from the input signal. Also, a band-pass filter can be formed by subtracting one high-cut output signal from another where a common input signal is used. Furthermore, the band-pass filter can be converted into a reject filter by subtracting the band-pass output signal from the input signal all of which is shown by way of the dashed line and subtracter shown in FIG. 2.

Running time on a computer for the digital time-variant Hilbert transform filters of the invention is about twice that of known digital time-invariant filters. However, as discussed above, the input signal preferably does not have frequency content above half the Nyquist frequency. Hence, interpolation or a priori high-cut filtering is necessary to reject frequencies above half Nyquist, if any, which increases the factor to about eight. Also, if run twice for band-pass filtering, 16 times the computational effort of known digital time-invariant filters is involved. However, this is still entirely within reason on a modern computer, particularly if equipped with a high-speed correlator or array processor.

The invention provides digital time-variant filters that are stable, efficient, and flexible. The filters of the invention are particularly useful as a data pretreatment process which prepares, improves, and preconditions seismic information prior to that information being subjected to other computational operations, such as cross-correlation, autocorrelation, wavelet compression, deconvolution, and the like, and then being displayed as a seismic section. Although the filters of the invention will most frequently be used in combination with other mathematical manipulations, it should be appreciated that they have an inherent utility independent of the other operations.

While the invention has been described with a certain degree of particularity, it is manifest that many changes can be made in the details of construction and the arrangement of components without departing from the spirit and scope of this disclosure. It is understood that the invention is not limited to the exemplified embodiments set forth herein but is to be limited only by the scope of the appended claims, including the full range of equivalency to which each element thereof is entitled.

What is claimed is:

1. A method for processing a digital electrical signal having a time-varying character, comprising the steps of:
    selecting a digital time-varying control function signal for controlling cutoff frequency;
    discretely integrating the selected control function signal;
    combining the electrical signal with the integrated control function signal;
    applying a Hilbert transform operator to the combined electrical signal and integrated control function signal; and
    extracting a time-variant filtered electrical signal from the combined electrical signal and integrated control function signal to which the operator has been applied;
    wherein the Hilbert transform operator is determined by:
    selecting a roll-off interval for time-variant filtering;
    selecting an attenuation value for time-variant filtering;
    determining a Hilbert transform stength of weighting based on the selected attenuation value;
    determining a Hilbert transform operator length based on the selected roll-off interval and the attenuation value; and
    determining the Hilbert transform operator based on the strength of weighting and the operator length.

2. The method of claim 1 wherein the selected attenuation value is the miminum reject-zone attenuation.

3. The method of claim 1, further comprising the step of subtracting the filtered electrical signal from the electrical signal.

4. The method of claim 1 further comprising:
    applying the Hilbert transform operator to a first and second combined electrical signal and integrated control function to generate first and second filtered electrical signals; and
    subtracting the first filtered electrical signal from the second filtered electrical signal.

5. The method of claim 4 further comprising the step of subtracting the difference between the first and second filtered electrical signals from the electrical signal.

6. A method for processing digitized seismic information, comprising the steps of:
    determining a Hilbert transform operator;
    selecting a digital time-varying control function signal for controlling cutoff frequency;
    discretely integrating the selected control function signal;
    combining the digitized seismic information with the integrated control function signal;
    applying the Hilbert transform operator to the combined digitized seismic information and integrated control function signal; and
    extracting time-variant filtered digitized seismic information from the combined digitized seismic information and integrated control function signal to which the operator has been applied.

7. The method of claim 6 wherein the step of determining the Hilbert transform operator comprises:
    selecting a roll-off interval for time-variant filtering;
    selecting an attenuation value for time-variant filtering;
    determining a Hilbert transform strength of weighting based on the selected attenuation value; and
    determining a Hilbert transform operator length based on the selected roll-off interval and the attenuation value, wherein the Hilbert transform operator is determined based on the strength of weighting and the operator length.

8. The method of claim 7 wherein the selected attenuation value is the minimum reject-zone attenuation.

9. The method of claim 6, further comprising the step of subtracting the filtered digitized seismic information from the digitized seismic information.

10. The method of claim 6, further comprising the steps of:
    applying the Hilbert transform operator to first and second combined digital seismic information and integrated control function signals to generate first and second filtered digital seismic information; and subtracting the first filtered digital seismic information from the second filtered digital seismic information.

11. The method of claim 10, further comprising the step of subtracting the difference between the first and second filtered digital seismic information from the digital seismic information.

12. An apparatus for processing a digital electrical signal having a time-variant character, comprising:
   means for inputting a selected digital time-variant control function signal for controlling the cut-off frequency of the electrical signal;
   means for discretely integrating the selected control function signal;
   means for combining the electrical signal with the integrated control function signal;
   means for applying a Hilbert tranform operator to the combined electrical signal and integrated control function signal, wherein the means for applying the Hilbert transform operator includes means for determining the Hilbert transform operator for controlling roll-off interval and attenuation, comprising:
   means for inputting selected Hilbert transform strength of weighting;
   means for inputting selected Hilbert transform operator length; and
   means for determining the Hilbert transform operator for the strength of weighting and the operator length inputs; and
   means for extracting a time-variant filtered electrical signal from the Hilbert tranformed combined electrical signal and integrated control function signal.

13. The apparatus of claim 12, further comprising means for subtracting the Hilbert transformed combined electrical signal and integrated control function signal from the electrical signal.

14. The apparatus of claim 12, further comprising:
   means for applying the Hilbert transform operator to first and second combined electrical signal and integrated control function signal to generate first and second filtered electrical signals; and
   means for subtracting the first filtered electrical signal from the second filtered electrical signal 15. The apparatus of claim 14, further comprising means for subtracting the difference between the first and second filtered electrical signals from the electrical signal.

* * * * *

UNITED STATES PATENT OFFICE
CERTIFICATE OF CORRECTION

PATENT NO. : 4,535,417
DATED : August 13, 1985
INVENTOR(S) : Kenneth L. Peacock

It is certified that error appears in the above-identified patent and that said Letters Patent are hereby corrected as shown below:

Column 8, line 4, Equation (1), delete ")";

line 20, "$\alpha$" should read --$\Delta$--;

line 56, "$AV_{LF'WF}$" should read --$AV_{LF''WF}$--.

Signed and Sealed this

Fifth Day of January, 1988

Attest:

DONALD J. QUIGG

*Attesting Officer*    *Commissioner of Patents and Trademarks*